US 6,782,061 B2

(12) United States Patent  
Ichihara

(10) Patent No.: US 6,782,061 B2
(45) Date of Patent: *Aug. 24, 2004

(54) AGC CIRCUIT

(75) Inventor: Masaki Ichihara, Tokyo (JP)

(73) Assignee: NEC Corporation (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,074

(22) Filed: Apr. 5, 1999

(65) Prior Publication Data

US 2003/0086513 A1 May 8, 2003

(30) Foreign Application Priority Data

Apr. 6, 1998 (JP) ............................................. 10-092140

(51) Int. Cl.[7] .............................................. H04L 27/08
(52) U.S. Cl. ..................................... 375/345; 455/250.1
(58) Field of Search ................................. 375/345, 230, 375/232; 455/245.1, 324, 550, 250.1; 360/31; 330/129

(56) References Cited

U.S. PATENT DOCUMENTS

| 4,263,560 | A | * | 4/1981 | Ricker ........................ 330/129 |
| 5,095,536 | A | * | 3/1992 | Loper ......................... 329/327 |
| 5,142,695 | A | * | 8/1992 | Roberts et al. ........... 455/234.1 |
| 5,493,712 | A | * | 2/1996 | Ramesh et al. ............. 375/345 |
| 5,594,760 | A |   | 1/1997 | Guillaud et al. ............ 375/345 |
| 5,831,781 | A | * | 11/1998 | Okamura ..................... 360/31 |

FOREIGN PATENT DOCUMENTS

| EP | 0812064   | 12/1997 |
| JP | 58-108809 | 6/1983  |
| JP | 4-259125  | 9/1992  |
| JP | 5-160653  | 6/1993  |
| JP | 7-38358   | 2/1995  |
| JP | 8-288769  | 11/1996 |
| WO | 9102409   | 4/1991  |

* cited by examiner

Primary Examiner—Stephen Chin
Assistant Examiner—Kevin Kim

(57) ABSTRACT

In an AGC circuit for correcting a variation in received level by feeding back feedback data based on the difference between the average received level and a reference value in units of slots to an AGC amplifier, when the difference between the average received level and the reference value is equal to or more than a predetermined value, the value of the feedback data is set to be larger than a normal value.

5 Claims, 5 Drawing Sheets

AVERAGE RECEIVED LEVEL
(AVERAGE INPUT VALUE)

AGC CIRCUIT

BACKGROUND OF THE INVENTION

1. Field of the Invention

The present invention relates to an AGC circuit for calculating the average received level per slot, obtaining the difference between the calculated level and a reference value, and feeding back the difference to an AGC amplifier, thereby correcting any variations in the received level.

2. Description of the Prior Art

In mobile communications, the received signal strength greatly varies (a maximum of 80 dB is expected) owing to the influences of the distance between a base station and a terminal, fading due to the movement of a terminal, shadowing due to obstacles such as buildings, and the like. To stably receive and demodulate/decode such signals, the received levels must be corrected by using an AGC (Automatic Gain Control) circuit so as to level the received baseband signals.

This AGC circuit has been generally used in TV receivers and radios. According to a portable telephone based on the GSM or IS-95 CDMA scheme, a signal is transmitted from a base station in units of slots, and the signal is received and demodulated in units of slots on the terminal side. In this scheme, AGC must be performed to make the gain of the AGC amplifier constant within one slot, i.e., to make the relative received signal strength constant within one slot. Such an AGC circuit cannot be realized by a conventional AGC circuit designed to perform only analog signal processing. To realize this circuit, a method including digital signal processing in FIG. 1 is required.

FIG. 1 shows a conventional AGC circuit having such an arrangement.

FIG. 1 is a block diagram showing the schematic arrangement of the AGC circuit.

Since this block diagram of FIG. 1 aims at explaining only AGC operation, other portions that are not directly associated with AGC are omitted.

In this circuit, a received signal is a QPSK-modulated wave and is demodulated into two baseband signals, i.e., an I (In-phase component) and Q (Quadrature component) signals.

The received signal is converted into an IF signal by a receiver 1. The IF signal is amplified or attenuated by an AGC amplifier 2 and demodulated into I and Q baseband signals by a quadrature demodulator 3. The I and Q signals are respectively converted into digital signals by 8-bit A/D converters 4 and 5 (not limited to 8 bits).

Assume that a CDMA scheme with a chip rate of 4.096 MHz is used as a modulation scheme, and each A/D converter samples at 16.384 MHz, which is a conversion rate four times the chip rate. Assume also that the slot length is 625 $\mu$sec (i.e., 2,560 chips). In this case, therefore, each of the numbers of I and Q signal samples obtained amounts to 2560×4=10240 in a 1-slot interval.

A calculator 6 of received level calculates the average received level in the 1-slot interval from the above digital I and Q signals, and outputs the calculation result as an 8-bit straight binary code.

The calculator 6 of received level calculates the average received level in the following manner (for example).

Since each of the I and Q signals is an 8-bit signal from a positive peak to negative peak, the absolute value of each signal is obtained first. The maximum absolute value is obtained when each signal is completely saturated to the positive and negative peaks to have a rectangular waveform. This value of each of the I and Q signals is "01111111" in binary notation ("127" in decimal notation).

A received amplitude A should be calculated by:

$$A = \sqrt{I^2 + Q^2} \qquad (1)$$

However, since it is difficult to implement this calculation by hardware, an approximate value A' given by:

$$A' = \operatorname{Max}(|I|, |Q|) + \frac{\operatorname{Min}(|I|, |Q|)}{2} \qquad (2)$$

is used. FIG. 2 shows how the amplitudes A and A' differ from each other.

The circle in FIG. 2 (sequence 3) is the result obtained by plotting a vector (I, Q) when the amplitude A is normalized with 1. A plot of the amplitude A' on each vector yields the graphic pattern of sequence 1.

As can be seen from FIG. 2, the value A' is always slightly larger than the value A. The value A' is larger than the value A by an average of about 1.087 times, i.e., about 0.723 dB. Such a difference poses no problem in the AGC circuit. When the average received level of many samples corresponding to one slot (4×2560 samples=10240 samples) or more is to be obtained, we can assume that the obtained amplitude is always larger than the true amplitude by 0.723 dB.

A method of calculating the average received level in a 1-slot interval will be described next.

The average received level is obtained by dividing the sum of the values A' corresponding to one slot by the number of samples. Although the number of samples corresponding to one slot is 4×2560=10240, since it is difficult to divide by using this number, $2^{13}$=8192, which is the nearest power of 2, is used.

That is, the sum is shifted by 13 bit positions to the right. In other words, the output from the calculator 6 of received level is the result obtained by adding up the approximate values A' corresponding to one slot (10,240 samples) and shifting the sum by 13 bit positions to the right.

Since the maximum value of each of the I and Q signals is 127, a maximum value Amax obtained by the above calculation is expressed by:

$$A\max = \left(127 + \frac{127}{2}\right) \times 10240 \div 8192 \approx 237 \qquad (3)$$

This value can be expressed by an 8-bit straight binary code.

As described above, the average received level is calculated by calculating an approximate value of the average of amplitudes.

To be exact, the received level must be determined by obtaining the average of received powers. It is, however, difficult to calculate an average received power, because no suitable approximation method is available. Under the circumstances, an amplitude average approximate value is unwillingly used. The difference between the received level values respectively obtained by using power averages and amplitude averages will be examined.

A received signal S from a base station has in-phase and quadrature components written as:

$$S = I(t) \cdot \cos(2\pi f_c t) - Q(t) \cdot \sin(2\pi f_c t) \qquad (4)$$

In CDMA, since I(t) and Q(t) represent the sums of many independent speech channels, interference waves, and noise, the central limiting theorem holds. It therefore follows from this that I(t) and Q(t) each exhibit a Guassian distribution. If quadrature components respectively have independent Guassian distributions in this manner, the amplitude distribution of the synthetic signal exhibits a Rayleigh distribution. If amplitudes R have a Rayleigh distribution, the probability density distribution is given by:

$$P(R) = \frac{R}{b_0} \cdot \exp\left(-\frac{R^2}{2 \cdot b_0}\right) \qquad (5)$$

In equation (5), $b_0$ is a positive constant. Omitting a description of intermediate calculation, the power average is expressed by:

$$\overline{R^2} = \int_0^\infty R^2 \cdot \frac{R}{b_0} \cdot \exp\left(-\frac{R^2}{2 \cdot b_0}\right) \cdot dR = 2b_0 \qquad (6)$$

Omitting a description of intermediate calculation, the amplitude average is be expressed by:

$$\overline{R} = \int_0^\infty R \cdot \frac{R}{b_0} \cdot \exp\left(-\frac{R^2}{2 \cdot b_0}\right) \cdot dR = \sqrt{\frac{b_0 \cdot \pi}{2}} \qquad (7)$$

The dB difference between the received levels obtained by using the power and amplitude averages is given by:

$$d = 20 \cdot \log\left(\frac{\sqrt{\overline{R^2}}}{\overline{R}}\right) = \left(\frac{\sqrt{2 \cdot b_0}}{\sqrt{\frac{b_0 \cdot \pi}{2}}}\right) = 20 \cdot \log\left(\sqrt{\frac{4}{\pi}}\right) \approx 1.05 \text{ dB} \qquad (8)$$

That is, the received level calculated by using the power averages is equivalent to the value obtained by adding 1.05 dB to the received level calculated by using amplitude averages.

A method of determining reference level as an AGC target will be described next.

For example, the peak factor of a single code of a CDMA received signal is about 6 dB. When many users, e.g., 32 users, use this device, the peak factor increases by 30 dB to become 36 dB. It is, however, inadvisable to waste the dynamic range for a peak that rarely appears. In practice, it is probably appropriate to set the peak factor to about 10 to 12 dB. It follows from the foregoing that a value smaller than the peak value by 18 dB as a whole is appropriate as a reference value for the average received level, estimating a tracking error in AGC of about 6 dB.

Consequently, a reference value Aref is given by:

$$Aref = \frac{Amax}{10^{\frac{18}{20}}} = 29.6 \qquad (9)$$

Since this value is close to 32, which is the fifth power of 2, 32 is used as a reference value for the sake of simplicity. The dB error obtained when 32 is used in place of 29.6 is about 0.68 dB. This value can almost cancel out 0.723 dB, the dB error with an approximation calculation.

Feedback amount for an AGC value is determined by comparing the average received level calculated by the calculator 6 of received level with the reference value. Assume that the gain of the AGC amplifier 2 increases as the set value in a D/A converter 13 increases. A linearizer 12 corrects nonlinearity of the control voltage/gain characteristics of the AGC amplifier 2. Since this circuit is not directly associated with the present invention, a description thereof will be omitted.

After the AGC value which is the result obtained by adding up feedback values through an accumulator (comprised of an adder 10 and a register 11) is corrected by the linearizer 12, the AGC amplifier 2 is controlled by the AGC control voltage obtained by converting the corrected value through the D/A converter 13.

If, therefore, the average received level is higher than the reference level, the feedback amount becomes a positive value, and vice versa. However, since the AGC value is expressed in dB, the difference between the average received level and the reference level cannot be directly used as a feedback value.

The feedback value must be a value expressed in dB on the basis of the value obtained by dividing the average received level by the reference level. Since it is difficult to implement this calculation by means of hardware, a table 7 of feedback value, which uses an 8-bit average received level as an input address, is used in an actual circuit.

Each output from the table 7 of feedback value represents the dB difference between the average received power and the reference value. The accumulator (comprised of the adder 10 and the register 11) adds up the products of such outputs and appropriate coefficients 9. The linearizer 12 controls the AGC amplifier 2 through the D/A converter 13 by using the sum. This control is performed in units of slots.

The following problem is posed in the conventional circuit described above.

The dynamic range of the quadrature demodulator 3 is limited, and the number of bits of each of the A/D converters 4 and 5 is limited (e.g., 8 bits). If, therefore, an input signal having a received level excessively higher than the reference level is received, the A/D conversion result is saturated, as shown in FIG. 3. For this reason, as shown in FIG. 4, with regard to an input higher than the reference level by 10-odd dB or more, a value (solid line) considerably smaller than the true value (dotted line) is used as feedback data. As a result, when the received signal has an excessively high level, the convergence speed of the AGC circuit decreases.

SUMMARY OF THE INVENTION

The present invention has been made in consideration of the above situation, and has as its object to provide an AGC circuit which exhibits a high convergence speed even when a signal having an excessively high level is abruptly received.

In order to achieve the above object, according to the main aspect of the present invention, there is provided an AGC circuit for correcting a variation in received level by feeding back feedback data based on a difference between an average received level and a reference value in units of slots to an AGC amplifier, wherein when the difference between the average received level and the reference value is not less than a predetermined value, a value of the feedback data is set to be larger than a normal value.

The present invention has the following auxiliary aspects associated with the above main aspect.

The feedback data in the main aspect is obtained by using a table of feedback value.

This circuit comprises an A/D converter for A/D-converting the received level, and the predetermined value in the main aspect depends on the number of output bits of the A/D converter.

The predetermined value associated with the difference between the average received level and the reference value is 10 dB.

In addition, there is provided a radio receiver or portable telephone comprising the AGC circuit defined in the main aspect or any one of the auxiliary aspects.

According to the AGC circuit of the present invention, even when a signal having an excessively high level is abruptly received, the convergence speed of AGC can be increased as compared with the prior art.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF THE PREFERRED EMBODIMENT

A preferred embodiment of the present invention will be described below with reference to the accompanying drawings.

The present invention relates to an AGC circuit for calculating average received levels in units of slots, obtaining the difference between each calculated level and a reference value, and feeding back the result to an AGC amplifier, thereby correcting variations in received level. A circuit for obtaining feedback data by calculating the dB difference between each average received level and the reference value has been used in the prior art. A conventional equivalent scheme uses a simple dB conversion table. In contrast to this, the present invention is characterized in that when the average received level is higher than a reference level by a predetermined dB (e.g., 10 dB), a table of feedback value for obtaining feedback data larger than the value obtained by a general dB calculation is used.

Figure 1:
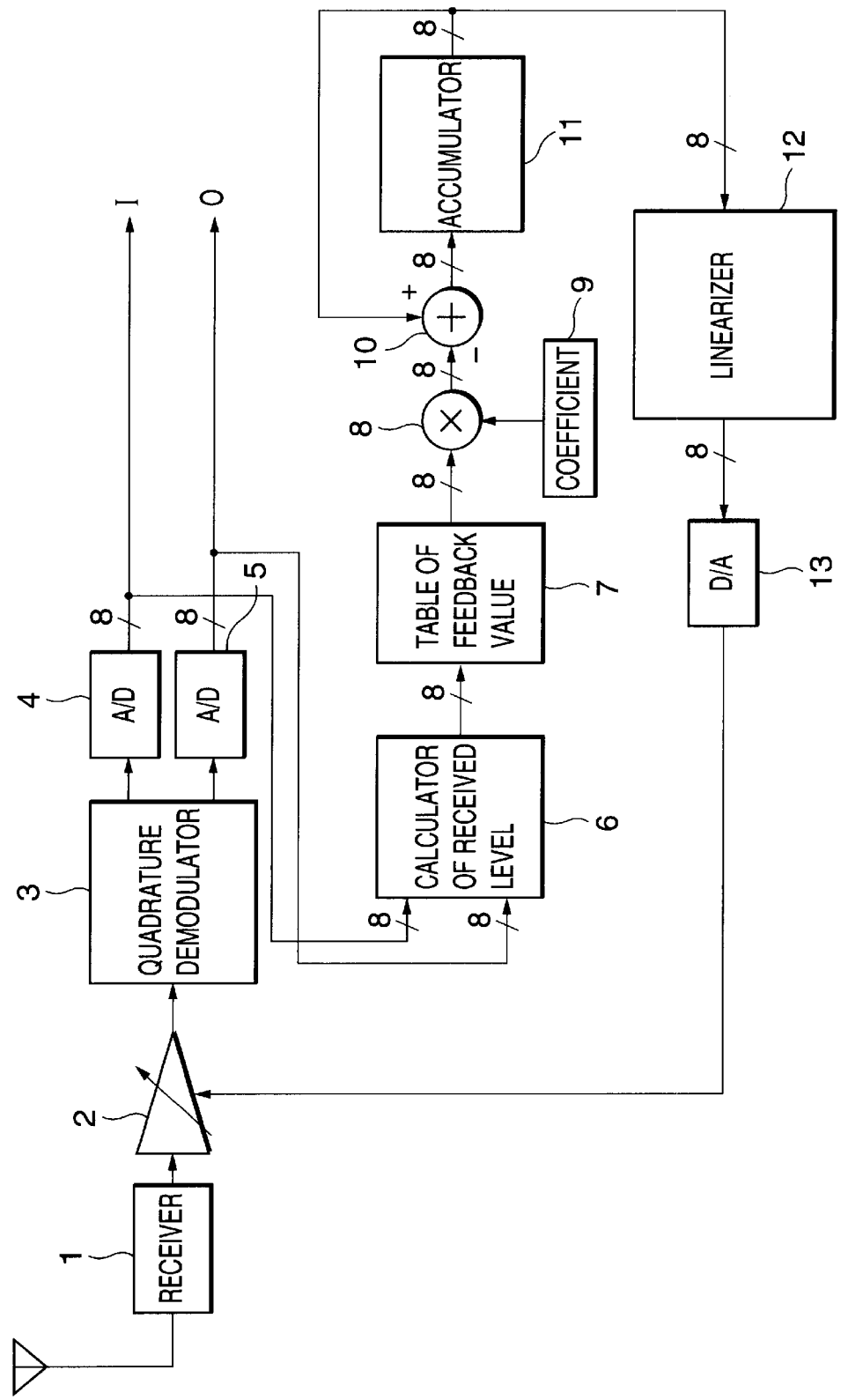
FIG. 1 is a block diagram schematically showing the overall arrangement of a conventional AGC circuit.
Figure 2:
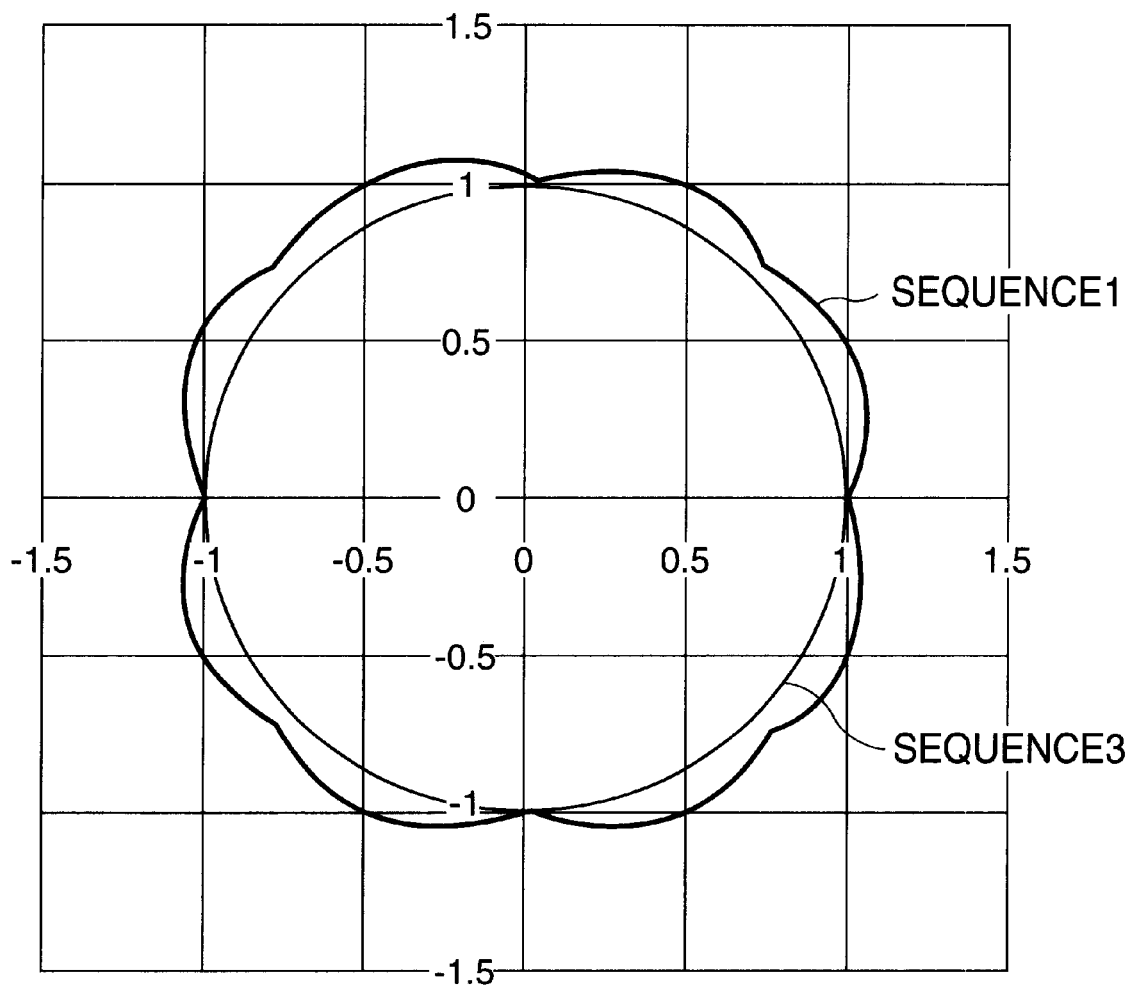
FIG. 2 is a graph showing how a received amplitude A and its approximate value A' differ from each other.
Figure 3:
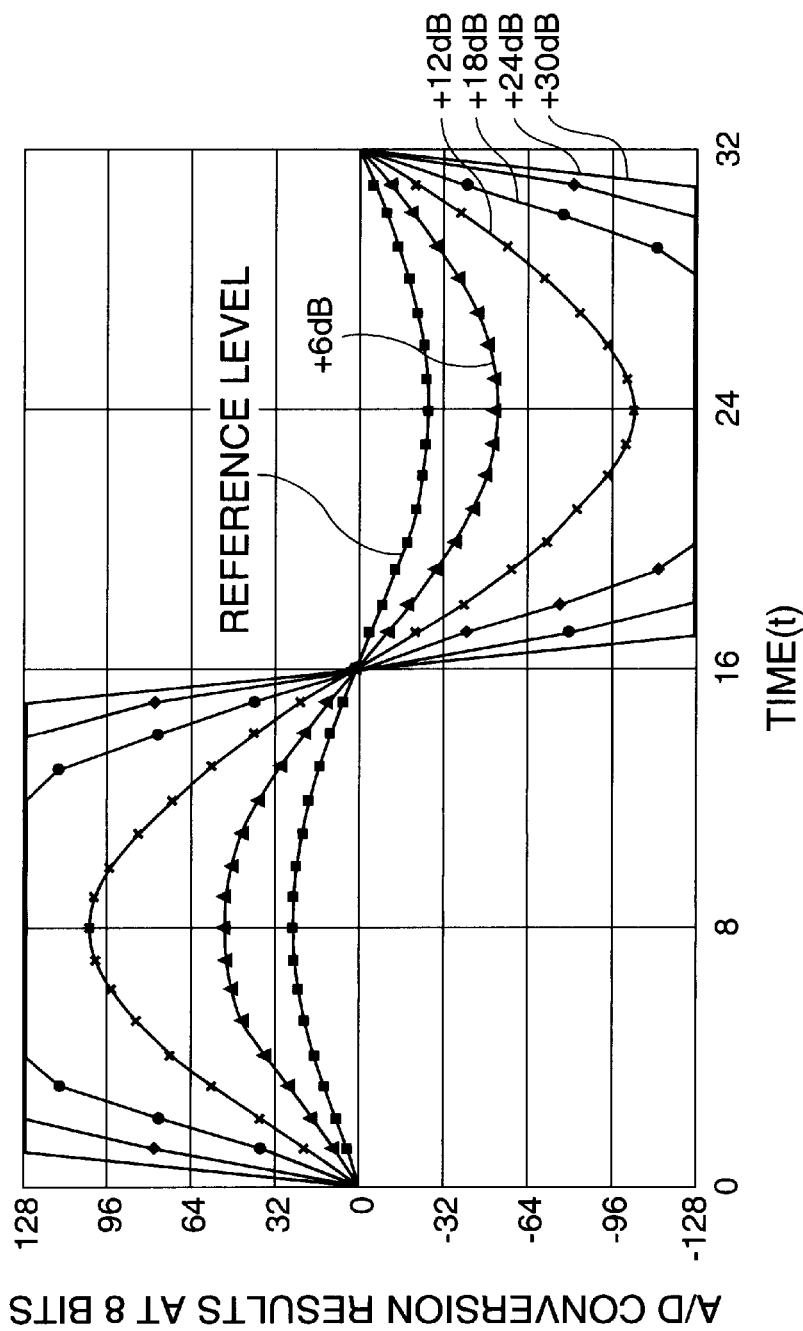
FIG. 3 is a graph showing how an A/D converter is saturated when an input signal having a level excessively higher than a reference level is received.
Figure 4:
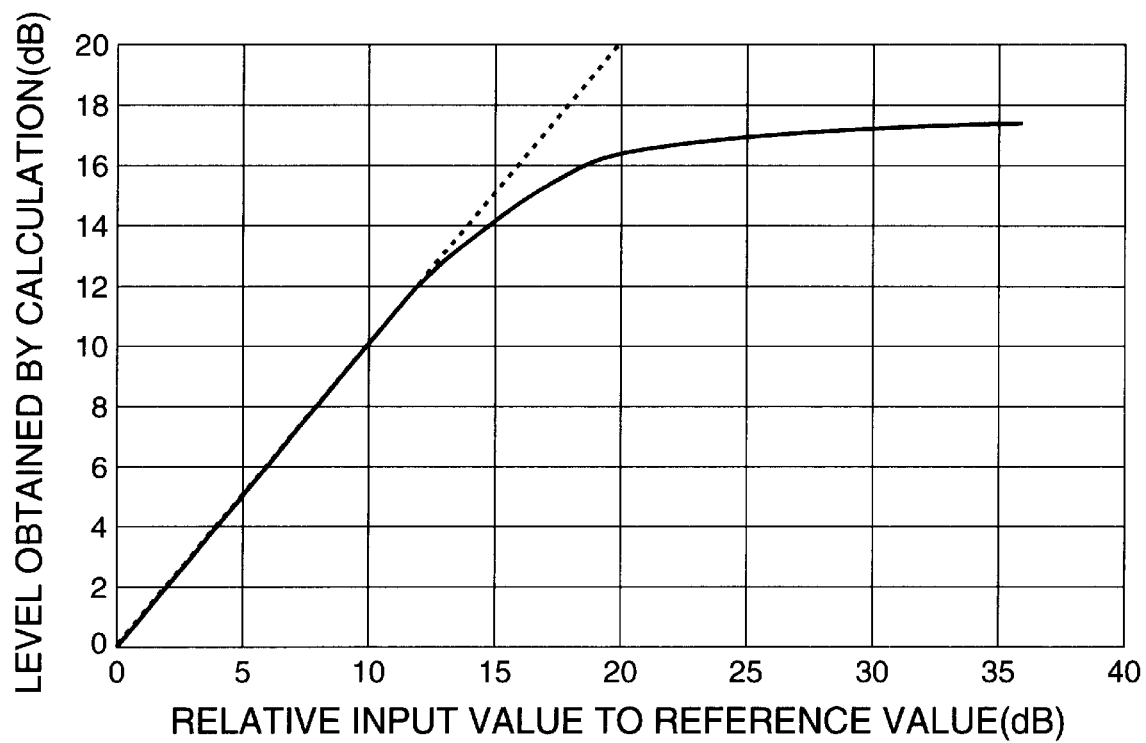
FIG. 4 is a graph for explaining feedback data obtained when an input signal having a level excessively higher than the reference level is received.

The arrangement of this embodiment is nearly the same as that of the prior art in FIG. 1 except for the feedback data written in the table 7 of feedback value in FIG. 1. The following description will therefore be made with reference to FIG. 1 as well.

Figure 5:
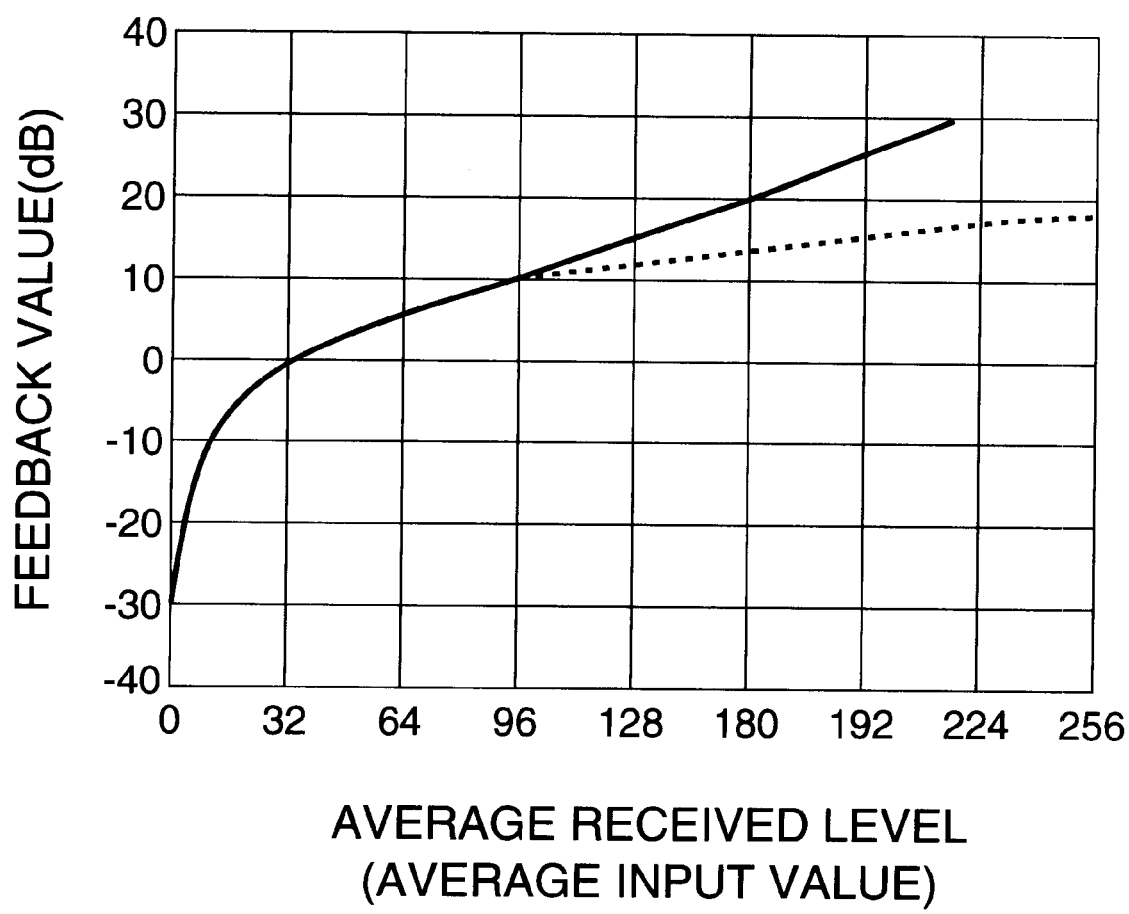
FIG. 5 is a graph showing the difference between the feedback data written in a table of feedback value in the prior art and that in an embodiment of the present invention.

FIG. 5 shows the difference between the feedback data written in the table 7 of feedback value in the prior art and that in this embodiment.

Referring to FIG. 5, the abscissa represents the average received level, which falls within the range in which it can be expressed by an 8-bit straight binary code. The value "32" on the abscissa is the reference level. Referring to FIG. 5, the dashed line represents the prior art, and the solid line represents this embodiment.

Referring to FIG. 5, within the range exceeding the reference value by 0 dB or more, the calculated value of average received level becomes smaller than the value of the true level owing to the influence of saturation of the A/D converter. To correct this, according to the solid line in FIG. 5, when the calculated value of average received level exceeds the reference value by 10 dB or more, feedback data larger than a normally calculated dB value is provided.

In this embodiment, when the calculated value of average received level is larger than the reference value by, e.g., 10 dB or more, the A/D converter is regarded to have saturated, and feedback data larger than the value obtained by a normal calculation is used.

The operation of this embodiment will be described below with reference to FIG. 1.

In the circuit shown in FIG. 1, the received signal is a QPSK-modulated wave and is demodulated into two baseband signals, i.e., an I (In-phase component) and Q (Quadrature component) signals.

The received signal is converted into an IF signal by a receiver 1. The IF signal is amplified or attenuated by an AGC amplifier 2 and demodulated into I and Q baseband signals by a quadrature demodulator 3. The I and Q signals are respectively converted into digital signals by 8-bit A/D converters 4 and 5 (not limited to 8 bits).

Assume that CDMA with a chip rate of 4.096 MHz is used as a modulation scheme, and each of the A/D converters 4 and 5 samples at 16.384 MHz, which is a conversion rate four times the chip rate. Assume also that the slot length is 625 $\mu$sec (i.e., 2,560 chips). In this case, therefore, each of the numbers of I and Q signal samples obtained amounts to 2560×4=10240 in a 1-slot interval.

A calculator 6 of received level calculates the average received level in the 1-slot interval from the above digital I and Q signals, and outputs the calculation result as an 8-bit straight binary code.

The calculator 6 of received level calculates the average received level in the same manner as in the prior art described above.

Feedback amount for an AGC value is determined by comparing the average received level calculated by the calculator 6 of received level with the reference value. Assume that the gain of the AGC amplifier 2 increases as the set value in a D/A converter 13 increases. A linearizer 12 corrects the nonlinearity of the control voltage/gain characteristics of the AGC amplifier 2.

After the AGC value which is the result obtained by adding up feedback values through an accumulator (comprised of an adder 10 and a register 11) is corrected by the linearizer 12, the AGC amplifier 2 is controlled by the AGC control voltage obtained by converting the corrected value through the D/A converter 13.

If, therefore, the average received level is higher than the reference level, the feedback amount becomes a positive value, and vice versa. However, since the AGC value is expressed in dB, the difference between the average received level and the reference level cannot be directly used as a feedback value.

The feedback value must be a value expressed in dB on the basis of the value obtained by dividing the average received level by the reference level. Since it is difficult to implement this calculation by means of hardware, the table 7 of feedback value, which uses an 8-bit average received level as an input address, is used in an actual circuit.

Each output from the table 7 of feedback value represents the dB difference between the average received power and the reference value. As described above, when the average received level is higher than the reference level by, e.g., 10 dB or more, feedback data larger than the normal dB value is output.

The accumulator (comprised of the adder 10 and the register 11) adds up the products of such outputs and appropriate coefficients 9. The linearizer 12 controls the AGC amplifier 2 through the D/A converter 13 by using the sum. This control is performed in units of slots.

What is claimed is:

1. An AGC circuit for correcting a variation in received level by feeding back feedback data based on a difference between an average received level and a reference value in units of slots to an AGC amplifier, said AGC circuit having an A/D converter for A/D converting said received level, said received level having a level causing said A/D converter to saturate, wherein when the difference between the average received level and the reference value is not less than a predetermined value, a value of the feedback data is set to be larger than a normal value wherein said circuit comprises the A/D converter for A/D-Converting the received level, and the predetermined value depends on the number of output bits of said A/D converter.

2. The circuit according to claim 1, wherein the feedback data is obtained by using a table of feedback value.

3. The circuit according to claim 1, wherein the predetermined value is 10 dB.

4. A radio receiver comprising said AGC circuit defined in claim 1.

5. A portable telephone comprising said AGC circuit defined in claim 1.

* * * * *